(12) United States Patent
Wilcox et al.

(10) Patent No.: US 10,521,001 B2
(45) Date of Patent: Dec. 31, 2019

(54) SYSTEM AND METHOD FOR RACK MOUNTABLE MODULAR DC POWER UNIT

(71) Applicant: Liebert Corporation, Columbus, OH (US)

(72) Inventors: Eric Wilcox, Cedar Park, TX (US); Bob Kippley, Eagan, MN (US); Matthew Schneider, Jersey City, NJ (US)

(73) Assignee: Vertiv Corporation, Columbus, OH (US)

( * ) Notice: Subject to any disclaimer, the term of this patent is extended or adjusted under 35 U.S.C. 154(b) by 434 days.

(21) Appl. No.: 14/915,493

(22) PCT Filed: Sep. 4, 2014

(86) PCT No.: PCT/US2014/054020
§ 371 (c)(1),
(2) Date: Feb. 29, 2016

(87) PCT Pub. No.: WO2015/035004
PCT Pub. Date: Mar. 12, 2015

(65) Prior Publication Data
US 2016/0209901 A1    Jul. 21, 2016

Related U.S. Application Data

(60) Provisional application No. 62/008,197, filed on Jun. 5, 2014.

(30) Foreign Application Priority Data

Sep. 6, 2013    (CN) .......................... 2013 1 0403989

(51) Int. Cl.
*H02J 3/00*    (2006.01)
*G06F 1/30*    (2006.01)
(Continued)

(52) U.S. Cl.
CPC ................ *G06F 1/30* (2013.01); *G06F 1/188* (2013.01); *G06F 1/263* (2013.01); *H05K 7/1492* (2013.01)

(58) Field of Classification Search
USPC .......................................................... 307/23
See application file for complete search history.

(56) References Cited

U.S. PATENT DOCUMENTS

| 6,018,456 A | 1/2000 | Young et al. |
| 2008/0030078 A1 | 2/2008 | Whitted et al. |

(Continued)

FOREIGN PATENT DOCUMENTS

| CN | 102004536 A | 4/2011 |
| CN | 102522797 A | 6/2012 |

(Continued)

OTHER PUBLICATIONS

Written Opinion of Intellectual Property Office of Singapore for corresponding Singapore Application No. 11201601223Y dated Nov. 23, 2016, 5 pages.

(Continued)

*Primary Examiner* — Rexford N Barnie
*Assistant Examiner* — Dru Parries
(74) *Attorney, Agent, or Firm* — Harness, Dickey & Pierce, P.L.C.

(57) ABSTRACT

The present disclosure relates to a modular DC power unit having a form factor enabling mounting in at least one of a plurality of component locations of an equipment rack. The modular DC power unit provides DC power to a DC bus of the equipment rack. The modular DC power unit may have a chassis defining a plurality of slots into which a plurality of DC power supplies may be inserted. An AC input module may be used for receiving AC power from an external AC power source. A plurality of independent, modular DC (Continued)

power supplies, each having a form factor enabling insertion and mounting in one of the slots of the chassis, may be mounted in the chassis. A controller may be in communication with the DC power supplies and housed within the chassis. A DC bus housed within the chassis communicates with the DC power supplies and supplies DC output power from the DC power supplies to the separate DC bus housed within the equipment rack.

21 Claims, 12 Drawing Sheets

(51) Int. Cl.
  *G06F 1/18* (2006.01)
  *H05K 7/14* (2006.01)
  *G06F 1/26* (2006.01)

(56) References Cited

U.S. PATENT DOCUMENTS

| 2011/0304211 A1 | 12/2011 | Peterson et al. |
| 2013/0198533 A1 | 8/2013 | Bailey et al. |
| 2013/0227309 A1 | 8/2013 | Jau et al. |
| 2016/0209901 A1 | 7/2016 | Wilcox et al. |

FOREIGN PATENT DOCUMENTS

| CN | 103034320 A | 4/2013 |
| JP | 2012253933 A | 12/2012 |
| RU | 120260 U1 | 9/2012 |
| WO | WO-2012074743 A2 | 6/2012 |
| WO | WO-2015035004 A1 | 3/2015 |

OTHER PUBLICATIONS

1st Office Action and Search Report issued by the State Intellectual Property Office (SIPO) in corresponding Chinese Patent Application 201310403989.6 dated Nov. 3, 2017, 25 pages.

Office Action issued in corresponding Japanese Patent Application No. 2016-540372 by JPO dated Jan. 23, 2018, 7 pp.

Office Action for corresponding Russian Application No. 2016107437, dated Mar. 1, 2018, 15 pp.

International Search Report and Written Opinion of the International Searching Authority for PCT/US2014/054020, dated Jan. 5, 2015; ISA/EP.

Australian Examination Report for corresponding Australian Patent Application No. 2014315269 dated Mar. 16, 2019, 3 pp.

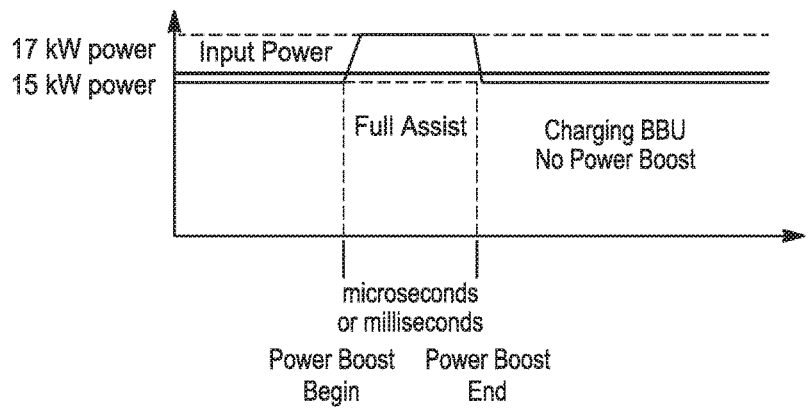
*Fig-7*
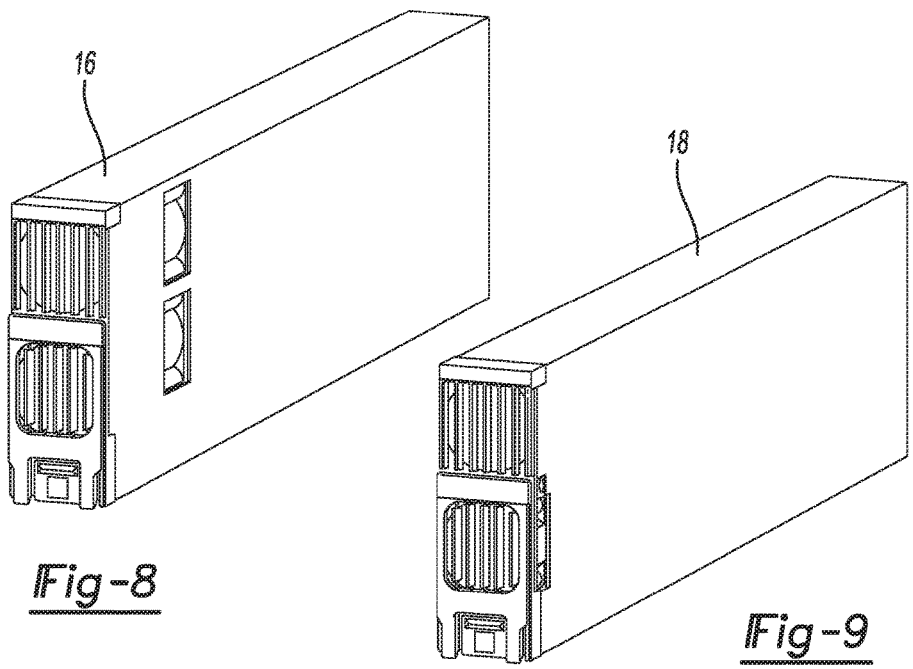
*Fig-8*
*Fig-9*

SYSTEM AND METHOD FOR RACK MOUNTABLE MODULAR DC POWER UNIT

CROSS-REFERENCE TO RELATED APPLICATIONS

This application is a 371 U.S. National Stage of International Application No. PCT/US2014/054020, filed Sep. 4, 2014, which claims the benefit of U.S. Provisional Application No. 62/008,197, filed on Jun. 5, 2014. This application also claims the benefit and priority of Chinese Patent Application for Invention No. 201310403989.6, filed Sep. 6, 2013. The entire disclosure of each of the above applications is incorporated herein by reference.

FIELD

The present disclosure relates to power systems for powering data center and other electrical components, and more particularly to a user configurable, rack mountable modular power unit for providing DC power to at least one DC bus within an equipment rack, to thus power other equipment components mounted in the equipment rack.

BACKGROUND

The statements in this section merely provide background information related to the present disclosure and may not constitute prior art.

Data centers that make use of standard equipment racks often will have equipment, for example file servers, which may be ordered and configured with different capabilities that affect the amount of power that each server will draw. As such, in many instances such components will have power supplies that are able to supply much more power than what may be needed. For example, three rack mountable servers may each be supplied with 1000 watt power supplies, but one may be equipped (e.g., graphic cards, memory cards, etc.) so that it only consumes 300 watts, the second may be configured so that it consumes only 500 watts, and the third may be configured to consume 900 watts. If these are the only components mounted in the rack, then one may conclude that a fair amount of excess power capacity has been provided at the rack. This is also known as power "overprovisioning," and happens quite frequently in data centers. Overprovisioning represents an added cost to the operator of the facility. The excess power capacity may also result in a greater degree of cooling capacity needing to be provided to the rack as compared to what would be required if only that specific amount of power required, and perhaps a small amount of additional power as "headroom", was supplied to the components of the rack. Still further, a powerful power supply present inside one rack mounted component may give rise to EMI concerns relative to adjacently mounted equipment. Such concerns may be obviated if the power supplies could all be located at one or more specific locations or areas of the rack. But with present rack mounted data center equipment each including its own power supply, this is not possible.

Still further, when equipment configuration changes need to be made to one or more existing rack mounted components that affect the power being drawn by the component(s), this can be somewhat inconvenient to the data center worker. For example, situations may arise where a configuration change is made to a given component, for example a server, to add one or more cards to the component that changes its power requirements. Increased power requirements may then necessitate changing the power supply in the server to accommodate the additional power required (assuming the power supply does not have sufficient capacity to handle the additional power draw). A rack system that essentially provides independent, custom configurable power supplies that directly power the various other rack mounted computing, storage, networking, etc. components in a given rack, would significantly simplify making equipment configuration changes to each rack, while allowing the user to deploy only that amount of power that is required by the new equipment configuration of the rack.

Finally, with equipment racks that accommodate individual rack mountable components that each have their own power supply, a substantial degree of wasted power capability may be present at each rack. So for example, if three rack mounted servers are each equipped with 1000 watt power supplies, but each one is configured such that it draws only 500 watts, then a total of 1.5 kw would be unused (i.e., "stranded" power capacity). This may be considerably more extra power capacity than what is needed. If this situation occurs in a large plurality of racks, for example dozens or hundreds of racks within a large data center, it will be appreciated that the collective stranded power capacity may represent a significant added cost to the data center operator.

SUMMARY

In one aspect the present disclosure relates to a modular power unit having a form factor enabling mounting in at least one of a plurality of component locations of an equipment rack. The modular power unit provides DC power to a DC bus of the equipment rack. The modular power unit may have a chassis defining a plurality of slots into which a plurality of DC power supplies may be inserted. An AC input module may be used for receiving AC power from an external AC power source. A plurality of independent, modular DC power supplies, each having a form factor enabling insertion and mounting in one of the slots of the chassis, may be mounted in the chassis. A controller may be in communication with the DC power supplies and housed within the chassis. A DC bus housed within the chassis communicates with the DC power supplies and supplies DC output power from the DC power supplies to a separate DC bus housed within the equipment rack.

In another aspect the present disclosure relates to a modular power unit having a form factor enabling mounting in one or more of a plurality of component locations of an equipment rack. The modular power unit provides direct current (DC) power to a DC bus of the equipment rack which is supplying DC power to one or more equipment components mounted in other ones of the component locations of the equipment rack. The modular power unit may comprise a chassis defining a plurality of parallel arranged slots into which a plurality of independent DC power supplies may be inserted. An alternating current (AC) module may be disposed within the chassis for receiving AC power from an external AC power source. A plurality of independent, modular DC power supplies may be included which have a common form factor enabling insertion and mounting in any one of the slots of the chassis. The modular DC power supplies may include at least one rectifier module. A controller may be in communication with the plurality of DC power supplies and housed in one slot of the chassis. A DC bus housed within the chassis and in communication with the DC power supplies may supply DC output power from the DC power supplies to a separate DC bus housed within the equipment rack.

In still another aspect the present disclosure relates to a method for providing direct current (DC) power to a DC bus of an equipment rack having a plurality of component locations therein. The equipment rack is designed to accommodate one or more equipment components mounted in ones of the component locations of the equipment rack, and to power the one or more equipment components using the DC power provided on the DC bus of the equipment rack. The method may comprise using a modular DC power unit having a form factor enabling it to be inserted into at least one component location to provide DC power to the DC bus of the equipment rack. A plurality of DC modular power supplies may be used which are mounted in a plurality of slots of a chassis of the modular DC power unit to generate the DC power applied to the DC bus of the equipment rack. A controller may also be used which is configured to be mounted in one of the slots of the chassis to communicate with and control the DC power supplies. An AC input module may be used to interface an external AC power source to the modular DC power unit to provide AC power to the modular DC power unit.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way. In the drawings:

FIG. 7 illustrates a graph to show how the maximum power output available from four BBU modules may be "capped" during a power boost operation to provide additional power to the rectifier modules to meet short term, increased demands for power;

FIG. 8 is a high level perspective view of one 12 VDC rectifier module that may be used to populate the modular power unit of FIG. 1;

FIG. 9 is a high level perspective view of a 12 VDC battery backup unit ("BBU") module that may also be used to populate the modular power unit shown in FIG. 1;

DETAILED DESCRIPTION

Figure 1:
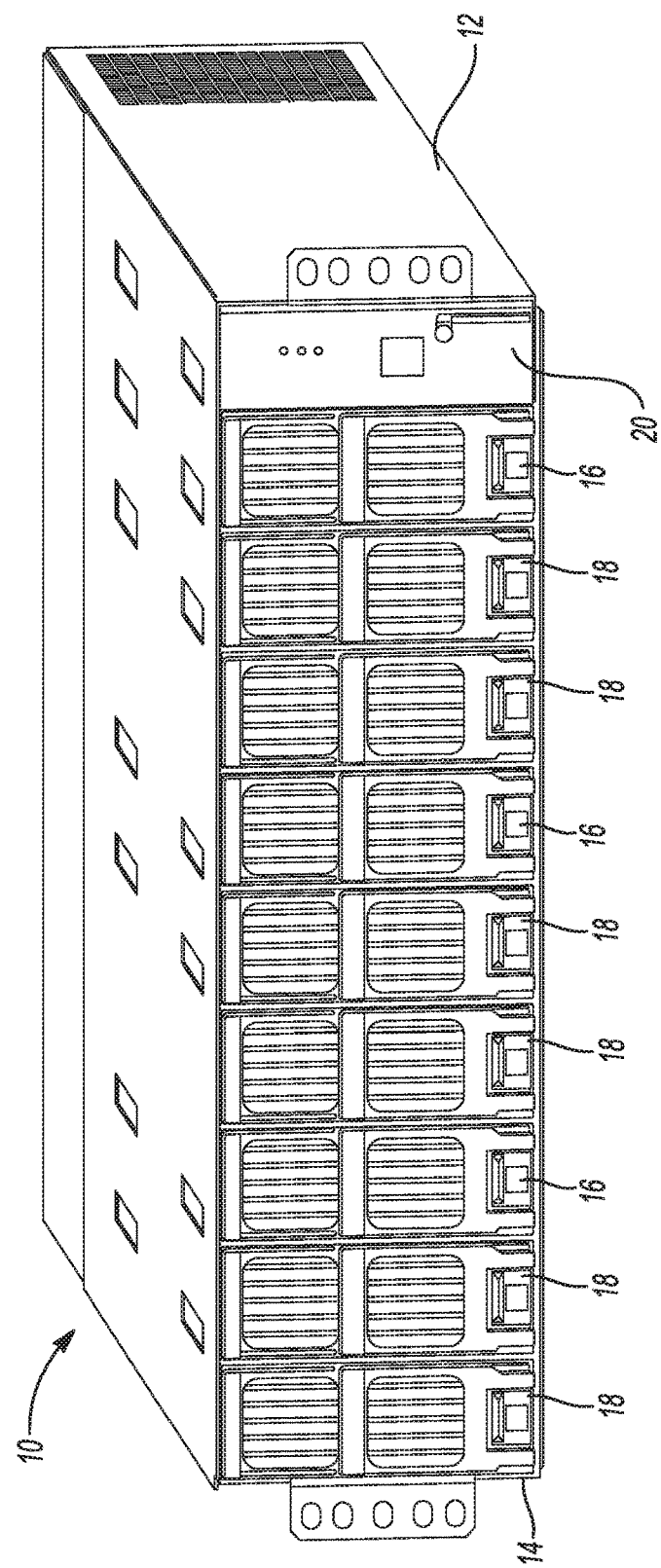
FIG. 1 is an enlarged perspective view of one embodiment of an integrated, rack mountable, modular power unit in accordance with the present disclosure.

The following description is merely exemplary in nature and is not intended to limit the present disclosure, application, or uses. It should be understood that throughout the drawings, corresponding reference numerals indicate like or corresponding parts and features.

Referring to FIG. 1 a rack mountable, modular, direct current (DC) power unit 10 (hereinafter simply "modular power unit 10") is shown in accordance with one embodiment of the present disclosure. The modular power unit 10 may be viewed as forming a "power system" for providing a user configurable DC power output to a DC bus of a conventional equipment rack. The DC output may be used to power any of a wide array of rack mounted data center or IT components such as servers, network switches, KVM appliances, routers, fan systems, etc.

The modular power unit 10 unit may include a chassis 12 having, in this embodiment, nine independent module slots 14 for receiving and housing a user configurable combination of power supply modules that may each take the form of either a rectifier module 16 and/or a battery backup module ("BBU") 18, as well as a slot for a controller card 20. For convenience, the rectifier modules 16 and the BBU modules 18 may at times be referred to throughout the following discussion collectively as the "power supply modules 16 and/or 18."

In the example shown in FIG. 1 the modular power unit 10 has a height of 3U and a width of 19", although these dimensions may be varied to meet the requirements of differently sized racks. The modular power unit 10 in this example is shown with three rectifier modules 16 and six BBU modules 18, although as mentioned previously this configuration is completely user configurable. The controller card 20 in this example has a 1U×3U (height) configuration.

Figure 2:
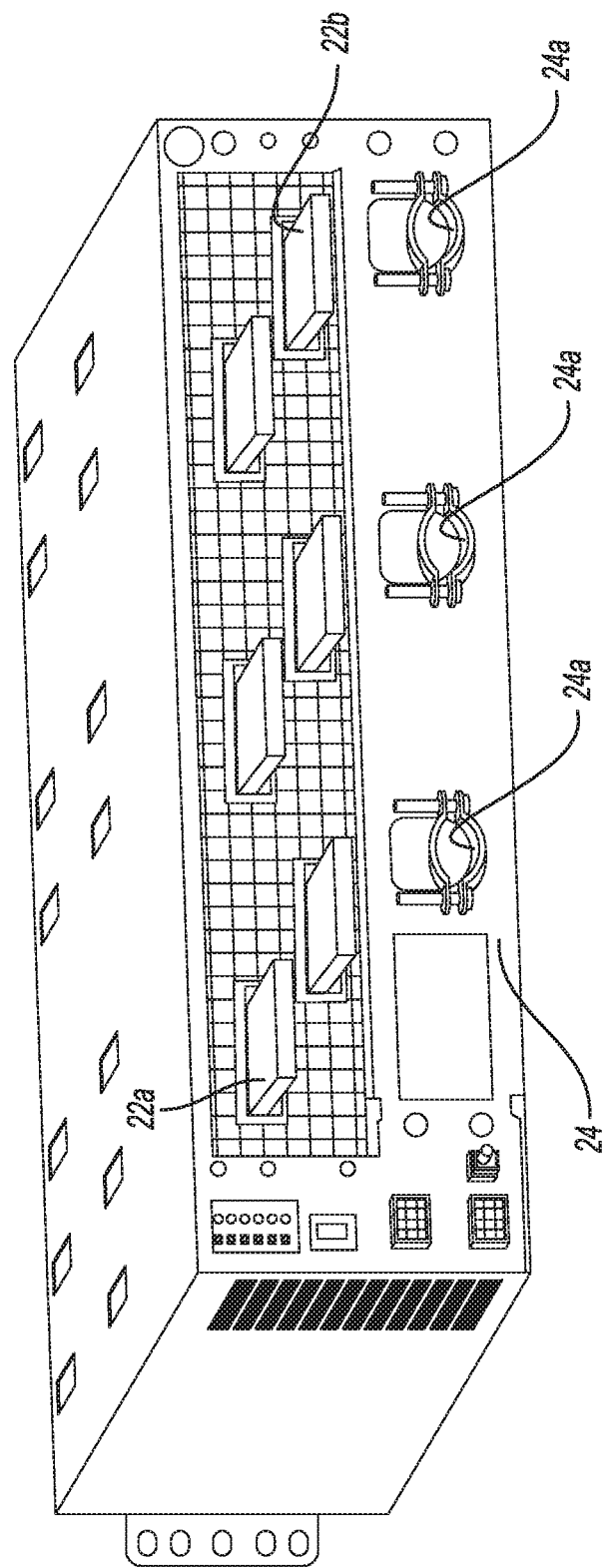
FIG. 2 is a perspective view of a rear of the modular power unit of FIG. 1 showing the DC supply and return busses.

FIG. 2 shows a rear view of the modular power unit 10. A +DC bus 22a and a return power bus 22b are provided that may be coupled to the DC bus in the equipment rack. Supply DC Bus 22a and return power bus 22b may each be ⅛ inch thick and copper plated. Openings 24a in this example permit up to three separate AC power cables to pass through a cover 24.

Figure 2A:
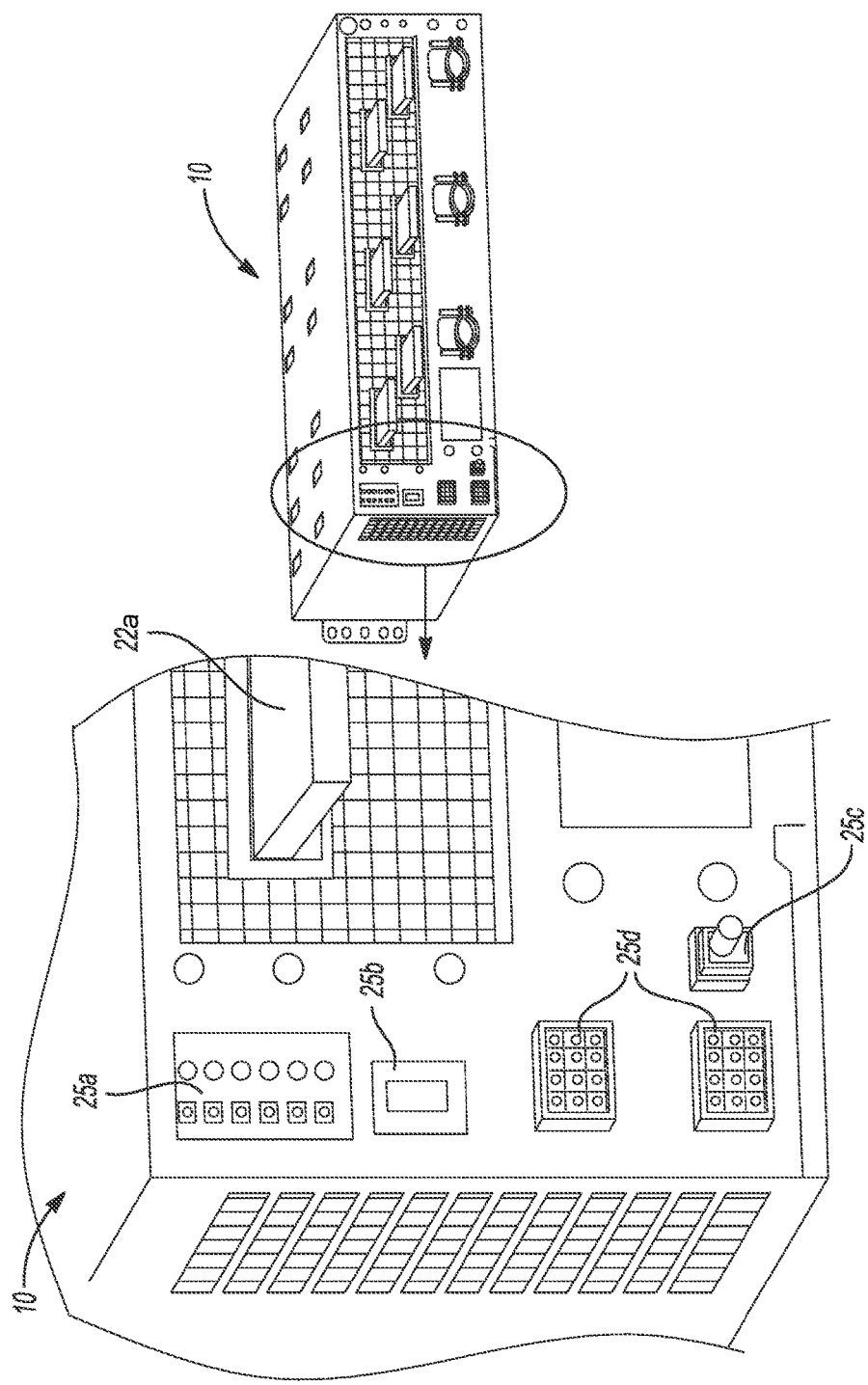
FIG. 2A is an enlarged perspective view of a portion of the rear of the modular power unit of FIG. 2 showing in greater detail connectors that enable various connections to be made with other external components.

FIG. 2A shows an enlarged view of just a portion of the rear of the modular power unit 10 to illustrate various connectors where connections with external components may be made. A connector 25a may be provided that allows a connection to be made to an independent component, for example a remote access appliance or a server, to inform the component of a power fail condition that has occurred. This may provide notice to the component that power from the modular power unit 10 will be lost within a short time (e.g., within 10 ms). Connector 25b may be a connector that allows a connection to an external Rack Management System (RMS) or a remote access appliance (e.g., a Universal Management Gateway (UMG) device). Connectors 25c are connectors that allow a suitable cable (not shown) which is connected to a communications bus of the controller card 20 (e.g., a CAN bus) to be connected to the modular power unit 10 to thus enable communications with the controller card 20. Preferably each modular power unit 10 includes two of the connectors 25c to enable multiple modular power units 10 be daisy chained together (i.e., in parallel). In this manner the controller card 20 is able to communicate with each one of the power supply modules 16 and/or 18 installed in the chassis 12. Connectors 25d are optional connectors that may be included to allow other inputs (e.g., sensors) to be provided to the controller card 20 of the modular power unit 10.

Figure 3A:
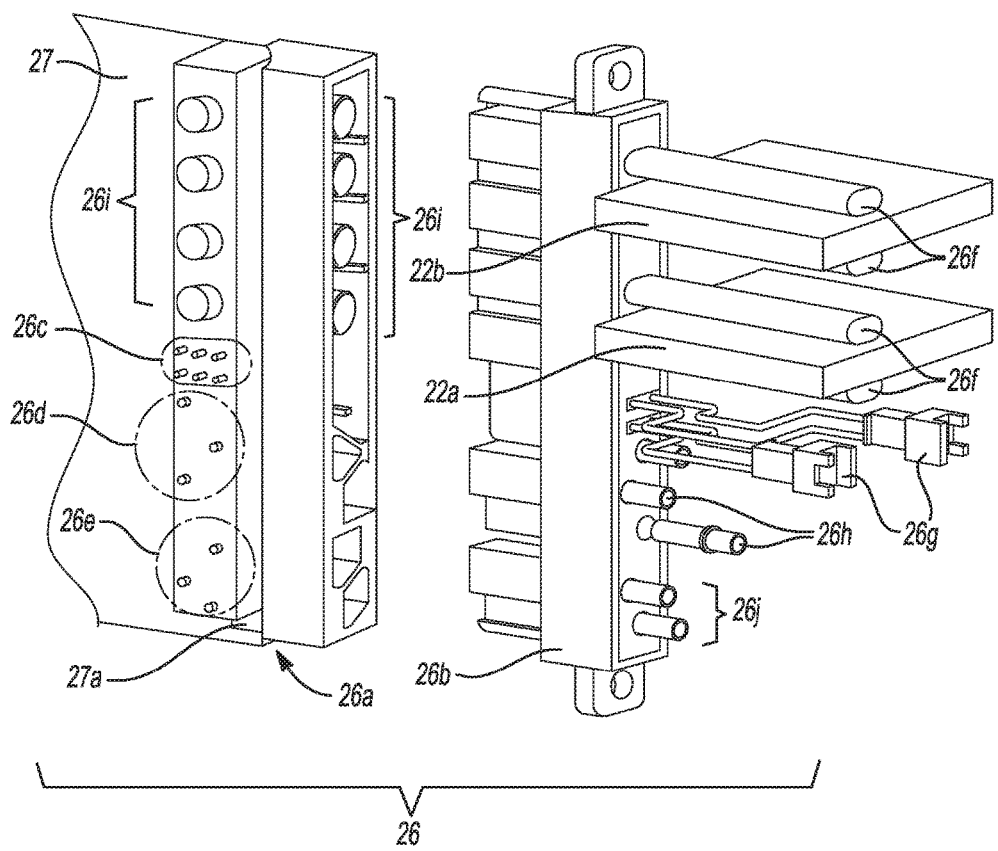
FIGS. 3A and 3B are perspective views of a connector assembly that may be used with the modular power unit of FIG. 1 for connecting one of the BBU modules or rectifier modules to the DC supply and return busses, as well as to a communications bus to communicate with the system controller card (SCC)
Figure 3B:
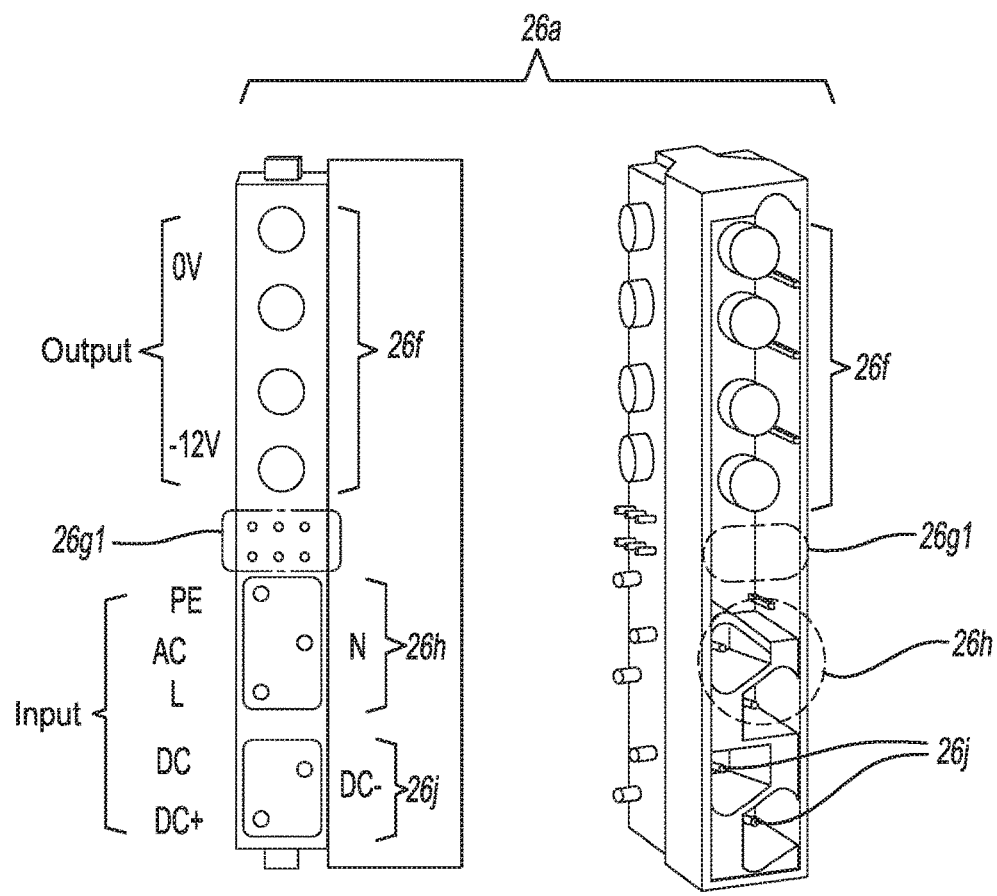

FIGS. 3A and 3B show a connector assembly 26 that may be used to couple the DC output from one of the power supply modules 16 or 18 to the DC busses 22a and 22b, as well as to enable communications with the controller card 20. Connector assembly 26 includes a first connector component 26a and a mating second connector component 26b. The first connector component 26a may connect to a suitable edge connector 27a on a printed circuit board (PCB) 27 of a given one of the power supply modules 16 or 18. First connector component 26a thus receives the DC power output from the given power supply module 16 or 18 and also connects to control lines (not shown) of the given power supply module 16 or 18. A plurality of pins 26c form control lines that may be used to communicate with the controller card 20. Pins 26d may be used to make the connection with an AC power source. Pins 26e provide an input to the PCB 27 to enable a DC signal to be applied to the DC power supply module 16 or 18 to gradually bring the module up to a desired DC voltage in a controlled fashion when the module 16 or 18 is first inserted into the chassis 12.

Referring further to FIGS. 3A and 3B, the second connector component 26b includes elements, for example copper pins 26f, which are adapted to engage with the +DC bus bar 22a and the power return bus bar 22b, to thus couple the DC output from the given DC power module 16 or 18, through the connector assembly 26, to the bus 22a. Pins 26f interface with pins 26i of the first connector component 26a. The first connector component 26a also has pins 26g1 (FIG. 3B) that may be in communication with connectors 26g. Connectors 26g may be coupled via a suitable cable (not shown) to enable communication with the controller card 20. Pins 26g1 interface the first connector component 26a to pins 26c of the edge connector 27a. Pins 26h of the first connector component 26a may be used to receive an external AC input and to interface the AC input to pins 26d of the edge connector 27a. Pins 26j of the first connector component 26a may interface with pins 26e of the edge connector 27a.

A significant advantage of the power supply modules 16 and 18 is that they are "hot swappable". By this it is meant that they are plug-and-play type modules that can be inserted and removed from a live DC power system with no damage. When one of the power supply modules 16 or 18 is inserted into the chassis 12 and coupled via connector assembly 26, the system output voltage will not be affected.

Figure 4:
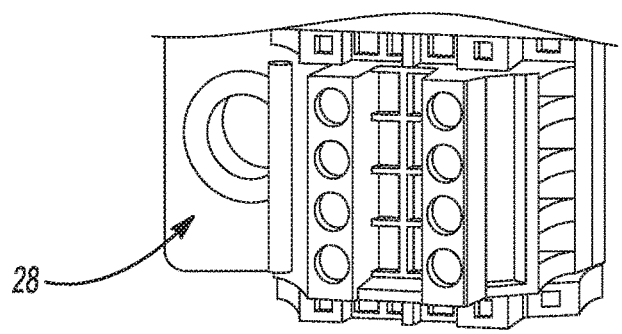
FIG. 4 is a perspective view of one of the AC input terminal blocks used in the modular power unit that enables a user to configure the modular power unit such that specific ones of the power supplies of the unit receive a predetermined AC input signal.
Figure 5:
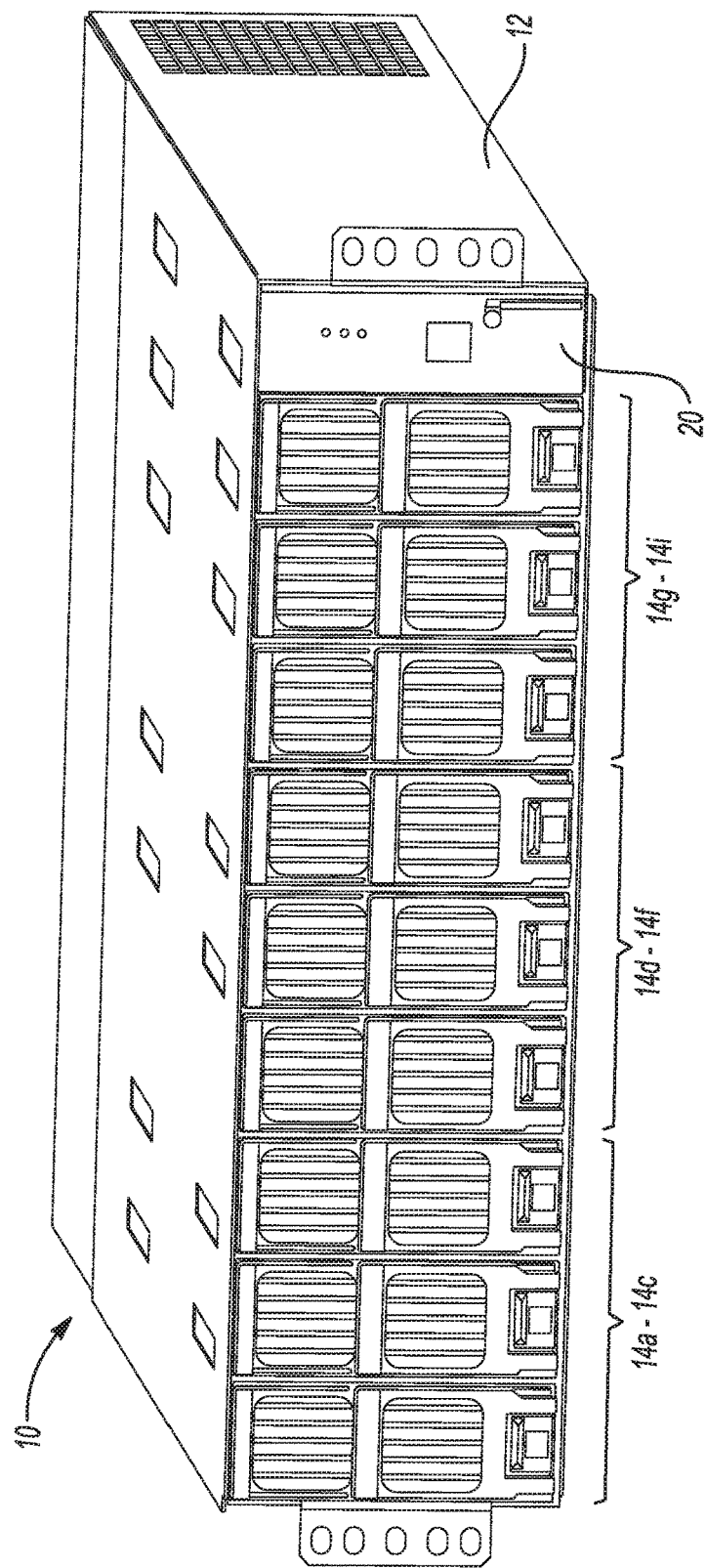
FIG. 5 is a front perspective view of the modular power unit of FIG. 1 illustrating one configuration for grouping slots of the chassis of the modular power unit so that AC power may be supplied from each of the three AC input terminal blocks to three separate groups of power supplies.

FIG. 4 shows an AC input terminal block 28 which is present adjacent each one of the openings 24a behind cover 24 in FIG. 2. The AC input terminal block 28 can be wired to accept, for example, any one of single phase 208 VAC, three phase 480 VAC and three phase 208 VAC. Each AC input terminal block 28 is electrically coupled to feed AC input power to the power supply modules 16 and/or 18 residing in three specific ones of the nine slots 14 of the chassis 12. In the example of FIG. 5, a first one of the AC input terminal blocks 28 may feed AC input power to the power supply modules 16 and/or 18 residing in chassis slots 14a-14c, a second one of the AC input terminal blocks 28 may provide AC input power to the power supply modules 16 and/or 18 residing in chassis slots 14d-14f, and a third AC input terminal block 28 may supply AC input power to the power supply modules 16 and/or 18 residing in chassis slots 14g-14i. Thus, three different AC input power supply configurations may be used to provide power to the power supply modules 16 and/or 18 residing in the modular power unit 10.

Figure 6:
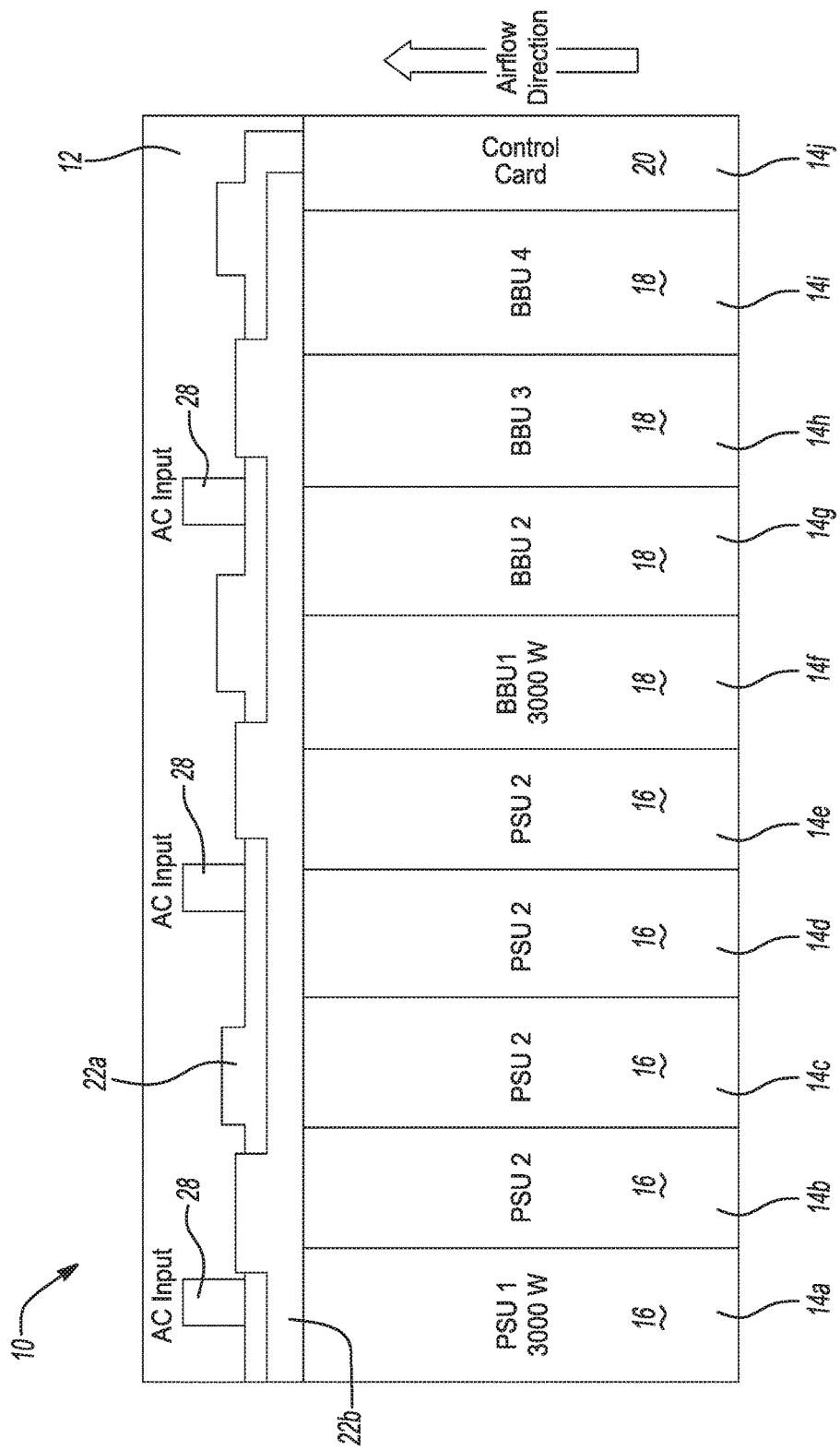
FIG. 6 is a high level block diagram type illustration of the modular power unit shown in FIG. 1 showing one example of a layout of the internal components of the unit.

FIG. 6 shows a block diagram illustration of the modular power unit 10 illustrating one example of how the rectifier modules 16, the BBU modules 18, the controller card 20, the DC busses 22a and 22b, and the AC input terminal blocks 28 may be packaged in the chassis 12 of the modular power unit 10. In this example rectifier modules 16 are present in chassis locations 14a-14e and BBU modules 18 are present in chassis locations 14f-14i. The modular power unit 10 may be configured to provide a user desired maximum power output. In one example, each of the modules 16 and 18 provides an output of 3000 KW (250 amps at 12 VDC), and nine total modules 16 and/or 18 provide a total power output of 24000 KW (2000 amps at 12 VDC) with N+1 redundancy. In this regard it will be appreciated that a user would typically configure the modular power unit 10 such that the unit is able to provide slightly more power than what is expected to be used. So in this example, the user might typically populate the equipment rack with components that are expected to draw no more than about 24 KW, and the modular power unit 10 would be capable of providing 27 KW (if all nine power modules 16 and/or 18 are used), or 24 KW with N+1 redundancy (i.e., the output of one of the nine power supply modules 16 and/or 18 being normally off-line but available if the need arises). However, it will be appreciated that the outputs of the power supply modules 16 and 18 may be varied to provide different levels of power (but still at the same 12 VDC) to the DC bus in the equipment rack.

The modular power unit 10 may accommodate a single phase or a three phase AC input signal. Either single cord or dual cord inputs may be received. If a single line cord is used, then the output of the modular power unit 10 in this example would be either 24 KW at N+1 redundancy or 12 KW at N+N redundancy. If a dual cord AC input is used then the output would be 9 KW with N+1 redundancy on each leg. Thus, it will be appreciated that when, for example, one rectifier module 16 and one BBU module 18 are used, the ratio of rectifier modules 16 to BBU modules 18 is 1:1, so then 3 KW of power will be available with 90 seconds of hold up time available. As another example, when two rectifier modules 16 are used with one BBU module 18, then a 6 KW output is provided with 3 KW of hold up power for 90 seconds.

The common power density of the rectifier module 16 and the BBU module 18 allows a wide degree of power control and supplemental power to be made available to the rectifier modules 16 to meet demands for additional power for transient ride through instances. An example of this is shown in the graph of FIG. 7. This graph shows the power output available from a modular power unit 10 configured with 5 rectifier modules 16 at 3 KW each, for a total output of 15 KW, and 4 BBU modules 18 at 3 KW each, for a total of 12

KW. However, in this example the output from the 4 BBUs 18 has been limited to a maximum of 2 KW and made available to meet a short duration additional demand for power beyond what the 5 rectifier modules 16 are capable of providing. Thus, even though the modular power unit's rectifier modules 16 may only be able to supply 15 KW, an additional 2 KW may be made available from the BBUs 18 to meet short term power demands associated with transient ride through instances (typically on the order of microseconds or milliseconds in duration) that exceed what the rectifier modules 16 are capable of meeting. This feature is expected to provide a significant cost benefit by reducing the need to "over-provision" the modular power units 10 with additional rectifier modules 16 to handle anticipated short duration transient ride through instances that cause temporary increases in power draw beyond what the rectifier modules 16 would ordinarily be expected to handle. The BBUs 18 may thus be used for two functions: 1) to provide a degree of short term "power boost" to the rectifier modules 16; and 2), to provide holdup power in the event of a disruption in the AC source power to the modular power unit 10.

The power boost feature described above may be implemented by using the controller card 20 to monitor the battery levels of the BBU modules 18. Provided that the battery levels are at a sufficient minimum predetermined level, the controller card 20 may send a signal to each of the BBU modules 18 which enables them to provide their output when the sensed bus voltage on the +DC bus 22a momentarily drops below a minimum predetermined level, indicating a transient ride through instance is occurring. When such a transient ride through instance occurs, a limited amount of power from the BBU modules 18 is made available virtually instantaneously on the +DC bus 22a to supplement the output from the rectifier module(s) 16.

The above example of FIG. 7 should also make clear that since the maximum output from the BBU modules 18 may be capped at some amount that is less than the maximum power available from the BBUs (in this example power is capped at 2 KW), this means that the user has the option of configuring the BBU modules to provide a holdup time that is significantly longer than 90 seconds. Again, if the AC input power is lost, the 4 BBU modules 18 in this example could be power limited to provide 3 KW, even though a maximum of 12 KW would otherwise be available. As a result, the holdup duration would be significantly longer than 90 seconds, possibly up to 4 times as long (since only ¼ the maximum available output from the BBU modules is being used). Thus, this capability to limit the maximum power available from all of the available BBU modules 18 in the modular power unit 10 to some predetermined amount which is less than the maximum available power output provides the user with an extremely wide degree of power control customization when configuring the modular power unit 10.

FIG. 8 shows an example of a form factor for one of the rectifier modules 16. Each rectifier module 16 may have a form factor of 1U wide×3U high×450 mm deep. The rectifier module 16 may provide a fixed 12 VDC output, which in one embodiment is 3000 KW. Of course the rectifier modules 16 could be constructed to provide a greater or lesser output depending on user requirements. FIG. 9 shows one embodiment of the BBU module 18. In this embodiment the BBU module 18 has the same form factor as the rectifier module 16 (i.e., 1U×3U×450 mm deep). However, it will be appreciated that either the rectifier module 16 or the BBU module 18, or both, could be configured with a form factor of 2U wide to occupy two locations in the chassis 12 rather than one. The common form factor, however, enables rectifier modules 16 and BBU modules 18 to be interchanged if the need arises. For example, assume that the user wishes to change an initial configuration of the modular power unit 10 from 6 rectifier modules and 3 BBU modules 18 to 4 rectifier modules and 5 BBU modules. This may be accomplished by simply removing two of the rectifier modules 16 and inserting two additional BBU modules 18 into their respective slots in the chassis 12. The common form factor enables rectifier modules 16 and BBU modules 18 to be mixed and matched into any user desired configuration. This feature is especially useful when equipment components are changed in the equipment rack that requires a modification of DC power requirements. Being able to reconfigure the modular power unit 10 by simply removing one or more rectifier modules 16 and/or BBU modules 18 and replacing the removed modules with additional rectifier modules 16 or BBU modules 18 may save significant time in reconfiguring the modular power unit 10 to accommodate the new equipment configuration in the equipment rack.

In one implementation the rectifier modules 16 are each of a constant power design, meaning that within a normal operating ambient temperature range and input voltage range, the maximum output power available will be a predetermined amount (e.g., 3000 W). With these ranges, in one example the rectifier modules 16 may operate in one of three operating modes, depending on load demands. If the ambient temperature rises above or the input voltage falls below acceptable values, the rectifier modules 16 may continue to operate but at derated output power levels. As one example, the three power modes may be as follows:

Constant Power Voltage mode: For any initial output voltage setting from 12.0V to 13.2V DC, output voltage remains constant regardless of load. This is the normal operating condition in which loads are supplied and batteries are float charged. The rectifier module 16 operates in the constant voltage mode unless the load increases to the point where the product of load current and output voltage is approximately 3000 W.

Constant Power Mode: As load increases above approximately 3000 W in this example, output current continues to increase, but output voltage decreases as required to maintain constant output power. The rectifier module 16 operates in the constant power mode unless load continues to increase to the point where the current limit setting is reached.

Constant Current Mode: If load increases to the current limit setting, the output voltage decreases linearly to maintain output current at the current limit setting.

Figure 10:
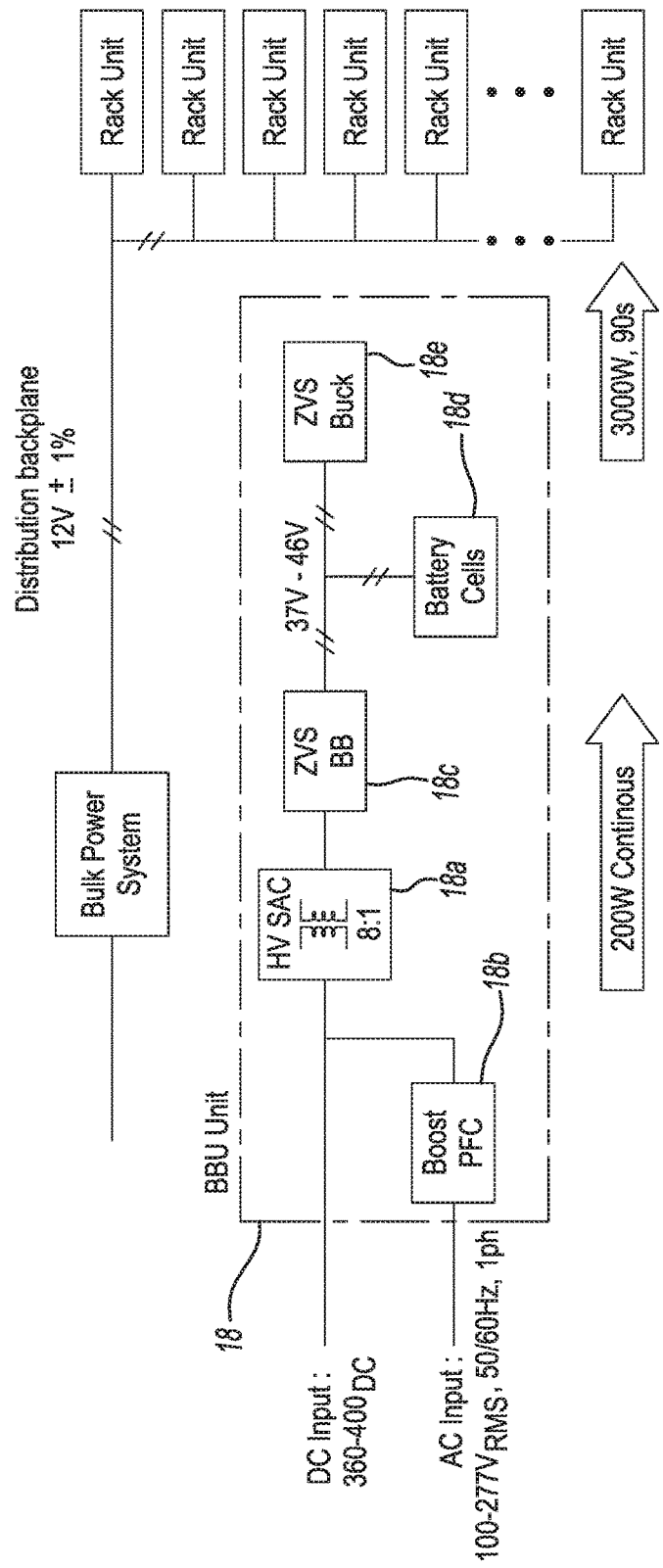
FIG. 10 is a block diagram of one embodiment of the BBU module.

Referring to FIG. 10, the BBU module 18 construction will be discussed in greater detail. As noted herein, an important feature of the modular power unit 10 is that the BBU module 18 is able to provide the same power density as what the rectifier module 16 provides. In one embodiment the power density of the BBU module 18 is about 20 W/in$^3$. This relation of 1:1 power density between the rectifier module 16 and the BBU module 18 enables these two components to be readily interchangeable. In one embodiment the BBU module 18 may include a high voltage sine amplitude converter ("HV SAC") 18a, a boost power factor correction (PFC) module 18b, a zero voltage switching ("ZVS") buck boost ("BB") module 18c, a plurality of battery cells 18d and a ZVS buck regulator module 18e. The HV SAC 18a may be a bus converter that receives a DC input of between 360 VDC-400 VDC and provides fully isolated 45V-50 V, 325 W output. The boost PFC Module 18b may operate as a trickle charger to charge the battery cells 18d. The ZVS BB module 18c may be a ZVS high efficiency converter. Each of the HV SAC module 18a, the ZVS BB module 18c and the ZVS buck regulator module 18e are available from Vicor Custom Power of Andover, Mass. The BB module 18c may operate from a predetermined input, for example a 38 to 55 VDC input, to generate a predetermined regulated output, for example a 5 to 55 VDC output. The ZVS buck boost module 18c enables high switching frequency (~1 MHz) operation with high conversion efficiency. High switching frequency reduces the size of reactive components enabling power density up to potentially 1,300 W/in$^3$. The ZVS buck regulator module 18e may comprise an array of six 3623 CHiP modules (40×23×7.3 mm), for receiving a 36 VDC-60 VDC input, and having a 11-13 VDC dynamic range, with a set point of 12 VDC at 42 A output (each module), non-isolated.

In a "Standby mode" (battery charging), the ZVS buck regulator module 18e is off, and the 12V distribution system is supplied by other components of the modular power unit 10 (for convenience designated simply as "Bulk power system" in the drawing figure). The HV SAC module 18a sources power either directly from the DC input or through the boost PFC module 18b from the AC input. The HV SAC module 18a has an isolated output (360-400V/8=45-50V) which supplies the ZVS buck boost module 18c, which charges the battery cells 18d. The battery charging profile, gaging and overall management should be implemented externally to the BBU modules 18. A back-up mode is entered if the DC bus voltage falls below a pre-set level. In this instance the input line to the BBU module 18 disappears or an appropriate flag is received, and the ZVS buck regulator module 18e is enabled and provides a regulated 12 VDC output up to about 250 A.

Figure 11:
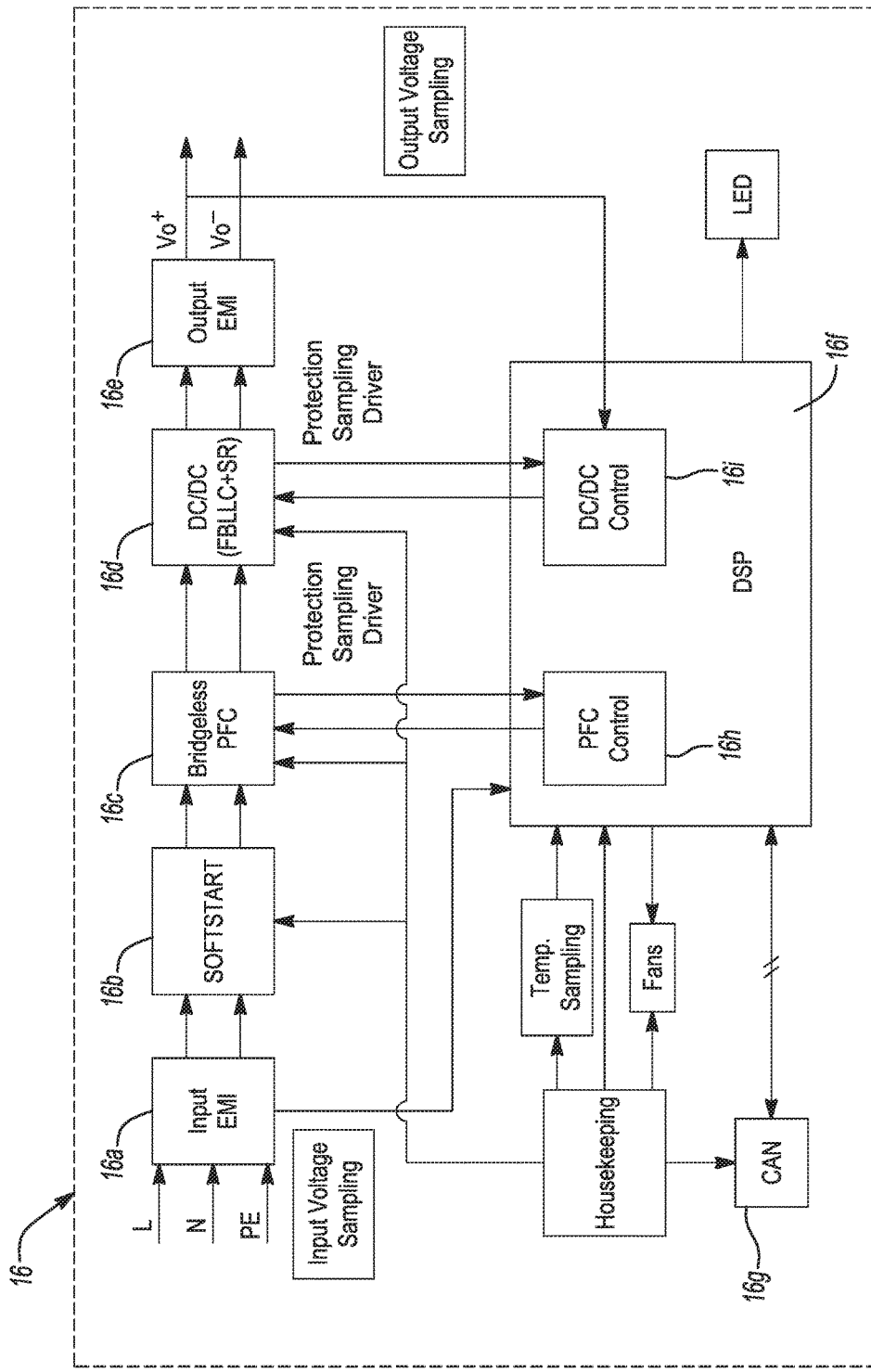
FIG. 11 is a block diagram showing internal subsystems and components of one embodiment of the rectifier module.

Referring to FIG. 11, one embodiment of the rectifier module 16 shown. The rectifier module 16 may include an input EMI circuit 16a, a softstart circuit 16b, a bridgeless PFC (power factor correction) circuit 16c, a DC/DC converter circuit 16d, an output EMI circuit 16e and a digital signal processor (DSP) 16f. The input EMI circuit 16a provides filtering to the AC power line and helps to prevent any spurious signal components from being placed on the AC power line. The softstart circuit 16b allows an input bank of capacitors (not shown) of the bridgeless PFC circuit 16c, as well as the DC/DC converter module 16d, to start in a controlled fashion to avoid tripping other input breakers or fuses. The bridgeless PFC 16c functions to provide power factor correction. The DC/DC converter circuit 16d takes the internal bank DC voltage and converts it to 12 VDC through synchronous rectification. The output EMI 16e provides output filtering and ripple noise reduction on a 12 VDC rail (not shown) of the rectifier module 16. The DSP 16f, in addition to controlling the other components of the rectifier module 16 discussed above, may monitor critical component temperatures and ambient temperature, as well as receive inputs from other components for system housekeeping functions. A CAN (controller area network) transceiver 16g enables the rectifier module 16 to communicate with the controller card 20. PFC control firmware 16h and DC/DC control firmware 16i may be embedded in the DSP 16f. The rectifier module 16 may have the following specifications:

accept an AC input voltage between about 176 VAC-310 VAC;

have an operating temperature of between about −20° C.-45° C.;

have Class A EMC performance rating;

have approximate peak efficiency of at least about 94%;

have a load share of about 5% of full load;

provide voltage regulation of +/−1%;

have a transient response of less than 200 microseconds and an overshoot of less than 5%;

have a current limit of 100%;

have a holdup time of about 10 ms;

have peak-to-peak noise of 50 mv (20 MHz); and have a UL 60950 safety rating.

Each BBU module 18, in one embodiment, may have the following specifications:

a fixed output of 12 VDC;

a power output of 3 KW;

an AC input voltage range of between about 200 VAC-310 VAC;

an operating temperature range between about 0° C. and 45° C.;

a class A EMC rating;

voltage regulation of +/−5%;

operational down to about 11.4 VDC before disconnect;

Lithium battery technology;

a holdup time of about 90 seconds; and a recharge time of about 100 minutes or less.

Figure 12:
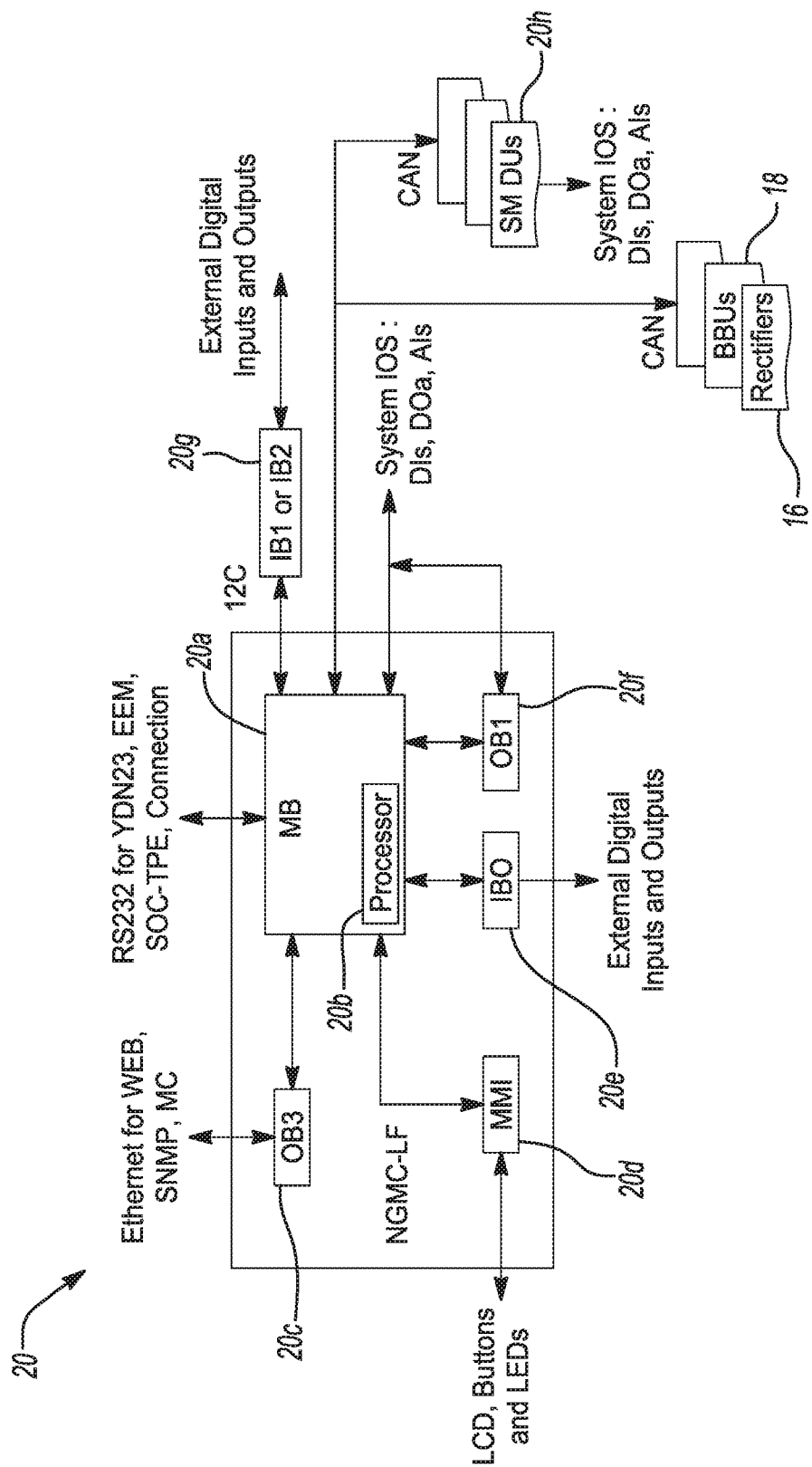
FIG. 12 is a block diagram view of one embodiment of the controller card.

Referring to FIG. 12 a block diagram of one embodiment of the controller card 20 is shown. The controller card 20 provides an interface to the modules 16 and/or 18 of the modular power unit 10, as well as an interface to subsystems (e.g., sensors) outside the modular power unit that may need to communicate with the modular power unit. The controller card 20 in this example may have a form factor of 95 mm high×444.5 mm deep. If the modular power unit 10 is intended to provide power to more than one DC bus then multiple controller cards 20 may be used, one for each DC bus that the unit 10 will be providing power to. If three modular power units 10 are provided, collectively they would be able to interface with up to 27 power supply modules 16 and/or 18.

The controller card 20 may include a motherboard 20a having a processor 20b mounted thereon. An optional board 20c may be provided for providing Ethernet interconnectivity. A man-machine interface (MMI) subsystem 20d may be included for enabling an interface to a user. Input option board 20e may be included for assisting the controller card 20 in collecting digital and analog inputs and outputs from other components (e.g., sensors) connected to the equipment rack. Optional board 20f may be used for assisting the motherboard 20a in obtaining information from other boards or components internal to the controller card 20. Another optional input board 20g may be provided to handle future inputs from other devices, sensors, etc., to the motherboard 20a. A SMDU (smart module distribution unit) 20h may also be used to collect information and data or to provide additional control functionality.

Communication from the controller card 20 to the power modules 16 and/or 18 may use, for example, the GBB CAN protocol. The protocol may be extended to add the data sent to/from the BBU modules 18. The modular power unit 10 may also be used in connection with a Rack Management System (RMS), available from Emerson Network Power Systems, which consolidates access to the power components of an equipment rack as well as other components used in a data center environment. The controller card 20 may provide an interface to the RMS.

The controller card 20 also helps a user to monitor and understand how much of the modular power unit's 10 capacity is currently being used so that a user may be better able to plan for expanding data center needs. The controller card 20 also is able to provide information and/or capabilities to the user on the following topics:

how close to maximum capabilities that the modular power unit 10 is currently operating at, and to see the current usage as a percentage of total available power from the modular power unit 10;

whether any alarms are present that indicate a problem with the modular power unit 10;

whether the incoming AC voltage is what is expected;

whether each modular power unit 10 is providing the expected DC output;

whether the actual configuration of each of the modular power units 10 matches the configuration that is expected;

how long the BBU modules 18 of the modular power unit 10 will hold up the other rack mounted components that the unit is providing power to;

how long it will take for the BBU modules 18 of any one or more of the modular power units 10 to recharge;

enabling the user to turn any one or more of the modular power units 10 off to make changes to configuration or wiring in the unit or the equipment rack;

enabling the user to perform a battery test to ensure that the BBU modules 18 of any one or more of the modular power units 10 will provide the necessary hold-up power in case the incoming AC power fails;

enabling the user to clear all alarms after investigating one or more alarms generated by one or more of the modular power units 10;

enabling the user to reset the modular power units 10 to take each one back to a known state for troubleshooting or to ensure that it will start in the correct state after a power-cycle;

enabling the user to control the amount of incoming AC power that the DC power system uses so that AC power can be controlled and budgeted;

enabling the user to set up a desired configuration so that a modular power unit 10 can provide an alert if any power modules 16 and/or 18 drop off or if the modular power unit 10 powers up without all of the expected units 16 and/or 18 being recognized as present;

enabling the user to control the amount of power that the DC power system provides so that power consumption and power utility costs can be managed effectively; and enabling the user to set the temperature set point for the over-temperature alerts from the equipment rack.

In configurations with the RMS, the controller card 20 may communicate with the RMS using SNMP over Ethernet. In configurations without the RMS, the controller card 20 may provide an interface using, for example, SNMP over Ethernet or the Intelligent Platform Management Interface (IPMI).

Figure 13:
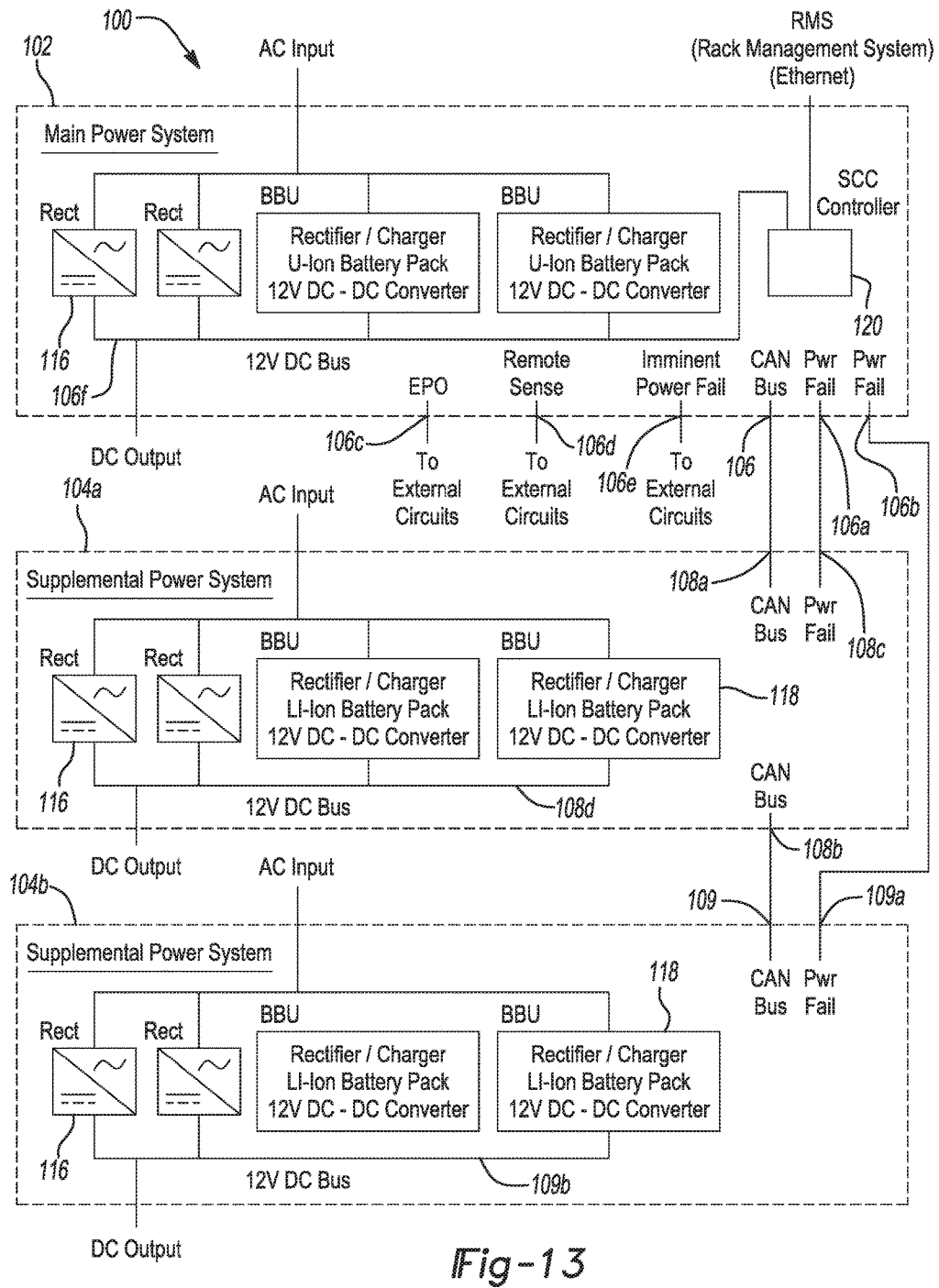
FIG. 13 is a block diagram of another embodiment of the present disclosure in which a main power system is included along with two supplemental power systems.

Referring now to FIG. 13, a power unit system 100 in accordance with another embodiment of the present disclosure is shown. Components in common with the modular power unit 10 are denoted by reference numbers increased by 100 over those used to describe modular power unit 10.

The power unit system 100 in this example includes a modular main power unit 102 and at least one modular supplemental power unit 104a. FIG. 13 shows two such modular supplemental power units 104a and 104b being used with the main power unit 102. The main power unit 102 in this example may be similar or identical to the modular power unit 10 in that it may include one or more rectifier modules 116, one or more BBUs 118, and a system controller card (SCC) 120. Alternatively, the system 100 may contain just BBUs 118 or just rectifier modules 116, together with the SCC 120. The main power unit 102 in this example may provide 2000 A at 12V DC (N+1 redundant), and may accommodate a total of up to nine power modules 116 and/or 118. A plurality of AC input terminal blocks (not shown) may be used for desired AC inputs (e.g., 208/240V AC, single phase AC inputs; or 208/240V AC 3-phase input feeds, or 277/480V AC 4-wire+PE AC input feeds or 200/208/240V AC single phase input feeds).

With further reference to FIG. 13, it will be noted that the supplemental power units 104a and 104b do not include a SCC 120. Instead, the SCC 120 from the main power unit 102 may use, for example, a CAN bus to communicate with each of the supplemental power units 104a and 104b. This is accomplished by suitable cabling which couples a CAN bus port 106 of the main power unit 102 with a first CAN bus port 108a of supplemental power unit 104a, and another cable which couples a second CAN bus port 108b of the supplemental power unit 104a with a CAN bus port 109 of the supplemental power unit 104b.

The main power unit 102 may also include power failure detecting ports 106a and 106b which are coupled to power failure detecting ports 108c and 109a of the supplemental power units 104a and 104b, respectively. This enables the main power unit 102 to detect if either of the supplemental power units 104a or 104b suffers a power failure.

The main power unit 102 may have additional ports, for example ports 106c for emergency power off ("EPO") to enable an immediate power down of the main power unit 102 in the event of an emergency command being issued from an IT professional or from external equipment. Still further ports may include a remote sense port 106d that may be coupled to an external circuit, and an "Imminent Power Fail" port 106e, for reporting an imminent power fail condition to other external circuits. A DC bus 106f may communicate with the DC bus in the equipment rack. Likewise, supplemental power units 104a and 104b may each include their own DC busses 108d and 109b, respectively, to supply power to the DC bus in the equipment rack.

The ability of the main power unit 102 to communicate with and control up to two additional supplemental units 104a and 104b, which do not require their own SCC 120, enables the system 100 to be expanded to meet changing power needs in a given equipment rack. The modular power unit 10 of the present disclosure thus provides a DC power unit which can be configured by a user to provide selected characteristics relating to total output power and holdup time. The modular nature of the rectifier modules 16 and the BBU modules 18, as well their common form factor and power density, enables these components to be quickly and easily interchanged when needed. This enables a user to quickly and easily reconfigure the modular power unit 10 as needed in the event the equipment configuration of the rack is changed. The modular power unit 10 is expected to reduce the tendency of users to overprovision power to a given equipment rack. The modular nature of the components of the modular power unit 10 is also expected to better accommodate growing data centers where equipment components are being added to existing equipment racks thus necessitating changes in power supply requirements. The ability of the modular power unit 10 to be power limited further allows the unit to be used to provide short term additional power to supplement the power output of the rectifier modules 16 to better handle transient ride through instances.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A modular power unit having a form factor enabling mounting in one of a plurality of component locations of an equipment rack, and wherein the equipment rack includes +DC and return DC power busses, to provide direct current (DC) power to a DC bus of the equipment rack which is supplying DC power to one or more equipment components mounted in other ones of the component locations of the equipment rack, the modular power unit comprising:
a chassis defining a plurality of slots defining a common form factor into which a plurality of DC power supplies may be inserted, the chassis being insertable into at least one of the plurality of equipment locations of the equipment rack;
the chassis having a rear cover;
an alternating current (AC) module disposed within the chassis for receiving AC power from an external AC power source, the AC module being disposed within the chassis and adjacent the rear cover and spaced from the plurality of slots so as not to interfere with any one of the plurality of slots, and the AC module enabling coupling with an AC power cable extending through an opening in the rear cover;
a plurality of independent, modular DC power supplies each having the common form factor enabling insertion and mounting of each said DC power supply into any one of the slots of the chassis;
a controller having dimensions in accordance with the common form factor, and inserted into one of the slots of the chassis, and being in communication with the plurality of DC power supplies;
a +DC bus and a DC bus both housed within the chassis rearwardly of the slots and forwardly of, and adjacent to, the AC module, such that the AC module is disposed rearwardly of the +DC bus and the –DC bus, and does not interfere with any one of the plurality of slots in the chassis, the +DC bus and the DC bus both having portions that project outwardly through the rear cover of the chassis, and further configured to engage with +DC bus and the return DC bus of the equipment rack as the chassis is inserted into the at least one of the plurality of equipment locations of the equipment rack, the +DC bus and the –DC bus within the chassis both being in communication with the DC power supplies, for supplying DC output power from the DC power supplies to +DC bus housed within the equipment rack; and
wherein the modular DC power supplies can each be removed and inserted into different ones of the plurality of slots without a need to uncouple the chassis from the +DC bus and the return DC bus of the equipment rack.

2. The modular power unit of claim 1, wherein at least one of the DC power supplies comprises a battery backup unit (BBU) module for providing DC output power.

3. The modular power unit of claim 1, wherein at least one of the DC power supplies comprises a rectifier module for supplying DC output power.

4. The modular power unit of claim 1, wherein the plurality of DC power supplies comprises at least one rectifier module and one battery backup unit (BBU) module.

5. The modular power unit of claim 1, wherein:
at least one of the power supplies comprises a rectifier module;
at least one of the power supplies comprises a battery backup unit (BBU) module; and
wherein the BBU module is configured to provide DC power on the +DC bus of the modular power unit during transient ride though instances to thus supplement the DC power being provided by the rectifier module.

6. The modular power unit of claim 5, wherein the DC output power from the BBU module is limited to an amount which is less than what the BBU module is capable of generating.

7. The modular power unit of claim 1, wherein:
at least one of the power supplies comprises a rectifier module;
at least one of the power supplies comprises a battery backup unit (BBU) module; and
wherein the BBU module is configured to provide DC power on the +DC bus of the modular power unit when AC power to the modular power unit is lost.

8. The modular power unit of claim 7, wherein the BBU module is configured to provide a level of DC power equal to the DC power output of the rectifier module for a duration of up to about 90 seconds, when AC power to the modular power unit is lost.

9. The modular power unit of claim 1, wherein:
at least one of the power supplies comprises a rectifier module;
at least one of the power supplies comprises a battery backup unit (BBU) module; and
wherein the rectifier module and the BBU module each provide an output of about 3 KW.

10. The modular power unit of claim 1, wherein the modular power unit has a form factor that uses three component locations of the equipment rack when the modular power unit is mounted in the equipment rack.

11. The modular power unit of claim 1, further comprising a connector assembly having a first connector component associated with a given one of the power supply modules, and a second connector component mounted within the chassis, the first and second connector components being connectable when the given one of the power supplies is inserted into the chassis and operative to:
transmit the DC output from the given one of the power supplies to the +DC bus mounted within the chassis; and
enable a connection to be made between a control bus in communication with the controller and the given one of the power supplies.

12. A modular power unit having a form factor enabling mounting in one or more of a plurality of component locations of an equipment rack, wherein the equipment rack includes a +DC bus and a return DC bus, the modular power unit providing direct current (DC) power to the +DC bus of the equipment rack, which in turn is supplying DC power to one or more equipment components mounted in other ones of the component locations of the equipment rack, the modular power unit comprising:
a chassis defining a plurality of parallel arranged slots having a common form factor into which a plurality of independent DC power supplies may be inserted;
a rear cover operably associated with the chassis;
a plurality of alternating current (AC) modules disposed within the chassis adjacent the rear cover and rearwardly of the slots so as not to interfere with any one of the slots, for coupling with power cabling extending through openings in the rear cover to receive AC power from an external AC power source;

a plurality of independent, modular DC power supplies each having the common form factor and being insertable and mountable in any one of the slots of the chassis, the modular DC power supplies including at least one rectifier module;
each one of the AC modules configured to feed AC power to designated ones of the modular DC power supplies associated with a predetermined subplurality of the slots;
a controller having the common form factor in communication with the plurality of DC power supplies, and housed in one of the slots of the chassis; and
a +DC bus bar and a −DC bus bar arranged parallel to one another and housed within the chassis rearwardly of the slots and forwardly of the rear cover, and generally parallel to the AC modules, portions of the +DC bus and the −DC bus of the modular power unit protruding outwardly through the rear cover of the chassis such to enable engagement with the +DC bus and return DC bus of the equipment rack when the chassis is inserted into at least one of the plurality of equipment locations of the equipment rack;
the +DC bus and the −DC bus housed in the chassis of the modular power unit further being in communication with the DC power supplies for supplying DC output power from the DC power supplies to the +DC bus housed within the equipment rack; and
wherein the modular DC power supplies can each be removed and inserted into different ones of the plurality of slots without a need to uncouple the chassis from the +DC bus and the return DC bus of the equipment rack.

13. The modular power unit of claim 12, wherein the plurality of DC power supplies includes at least one battery backup unit (BBU) module for providing a DC power output to the +DC bus within the chassis.

14. The modular power unit of claim 13, wherein the rectifier module and the BBU module provide the same level of DC power output.

15. The modular power unit of claim 13, wherein the BBU module is configured to supply DC power to the +DC bus of the chassis when a transient ride through instance is experienced, to thus supplement the DC power being provided by the rectifier module.

16. The modular power unit of claim 13, wherein the BBU module provides its DC power output to the DC bus within the chassis when the AC power from the external AC power source is lost.

17. The modular power unit of claim 16, wherein the BBU module is configured to provide its DC power for up to about 90 seconds when the AC power from the external AC power source is lost.

18. The modular power unit of claim 15, wherein the DC power provided by the BBU module is limited to an amount which is less than what the BBU module is capable of generating.

19. A method for providing direct current (DC) power to a DC bus of an equipment rack having a plurality of component locations therein, and wherein the equipment rack includes a +DC bus and a return DC bus and is designed to accommodate one or more equipment components mounted in ones of the component locations of the equipment rack, and to power the one or more equipment components using the DC power provided on the +DC bus of the equipment rack, the method comprising:
using a chassis having a form factor enabling it to be inserted into one of the component locations of the equipment rack, and wherein the chassis includes a plurality of adjacent slots each having a first form factor and a rear cover, and a +DC bus and a −DC bus each having portions projecting through the rear cover to make contact with the +DC bus and the return DC bus, respectively, of the equipment rack when the chassis is slidably inserted into the one of the component locations of the equipment rack;
using a plurality of modular DC power supplies each having a second form factor the same as the first form factor, and which are each mounted in the slots of the chassis, to generate the DC power applied to the +DC bus of the equipment rack;
using a controller having a second form factor the same as the first form factor and configured to be mounted in one of the slots of the chassis to communicate with and control the DC power supplies;
using an AC input module configured to be housed in the chassis adjacent the rear cover and rearwardly of the slots so as not to interfere with any of the slots, and to interface with an AC power cable associated with an external AC power source, where the AC power cable extends through openings in the rear cover into communication with the AC input module, to enable AC power to be provided to the modular DC power supplies; and
wherein the modular DC power supplies can each be removed and inserted into different ones of the plurality of slots without a need to uncouple the chassis from the +DC bus and the return DC bus of the equipment rack.

20. The method of claim 19, wherein the operation of using a plurality of modular DC power supplies comprises using at least one modular rectifier module and at least one modular battery backup unit (BBU) module.

21. A power unit system configured to be removably mounted in a plurality of equipment locations of an equipment rack, wherein the equipment rack includes a +DC bus and a return DC bus housed therein, the power unit system comprising:
a modular main power unit having a controller and being of dimensions enabling it to be inserted in a first component location within an equipment rack;
a modular supplemental power unit having dimensions enabling it to be inserted into a second component location within the equipment rack;
each of the modular main power unit and the modular supplemental power unit including:
a chassis defining a plurality of slots each having a first form factor into which a plurality of DC power supplies may be inserted;
a rear cover;
a plurality of independent, modular DC power supplies each having the first form factor, and being insertable and mountable in one of the slots of the chassis; and
a +DC bus and a −DC bus housed within the chassis, which each include portions protruding outwardly through openings in the rear cover for engaging with the +DC bus and the return DC bus, respectively, housed in the equipment rack when the chassis is slid into one of the equipment locations of the equipment rack, and the +DC bus and the −DC bus within the chassis further being in communication with the DC power supplies for supplying DC output power from the DC power supplies to the +DC bus housed within the equipment rack;
the modular main power unit further including a plurality of slots having a common form factor, with the controller being mounted in one of the slots and at least one additional DC power supply having the common form factor mounted in a different one of the slots, and at least one AC module mounted in the chassis of the main power unit adjacent the rear cover and rearwardly of the slots of the modular main power unit, the AC module being configured to connect with an AC power cable through an additional opening in the rear cover, the AC module being clear of the slots so as not to interfere with access to any of the slots of the modular main power unit, and configured to supply AC power to the at least one DC power supply; and wherein the modular DC power supplies can each be removed and inserted into different ones of the plurality of slots without a need to uncouple the chassis from the +DC bus and the return DC bus of the equipment rack.

* * * * *